United States Patent [19]

Adolfsson et al.

[11] 4,290,146

[45] Sep. 15, 1981

[54] MEASURING DEVICE FOR TRANSMITTING MEASURING SIGNALS VIA AN OPTICAL LINK

[75] Inventors: Morgan Adolfsson; Torgny Brogardh, both of Västeras, Sweden

[73] Assignee: ASEA Aktiebolag, Västeras, Sweden

[21] Appl. No.: 75,873

[22] Filed: Sep. 17, 1979

[30] Foreign Application Priority Data

Sep. 22, 1978 [SE] Sweden ............... 7809961

[51] Int. Cl.³ .................................. H04B 9/00
[52] U.S. Cl. ................... 455/612; 324/96; 324/99 R; 455/613
[58] Field of Search .......... 455/600, 601, 602, 603, 455/606, 607, 612, 613, 617; 324/96, 99 R, 130; 250/551

[56] References Cited

U.S. PATENT DOCUMENTS

| | | | |
|---|---|---|---|
| 3,913,001 | 10/1975 | Kayama | 250/551 |
| 4,070,572 | 1/1978 | Summerhayes | 455/613 |
| 4,091,734 | 5/1978 | Redmond et al. | 455/613 |
| 4,140,914 | 2/1979 | Jones | 250/551 |

*Primary Examiner*—Joseph A. Orsino, Jr.
*Attorney, Agent, or Firm*—Pollock, Vande Sande & Priddy

[57] ABSTRACT

A measuring device has a transmitter side that is connected to a receiver side over an optical transmission link. The transmitter side receives an input measurement signal from a transducer and applies the input signal to an adder that also receives a feedback signal from the receiver side. The adder generates a comparison signal that corresponds to the difference between the input signal and the feedback signal. The comparison signal is applied to a regulator on the receiver side. The regulator generates the feedback signal and an output signal having a magnitude corresponding to the magnitude of the input signal. Amplification of the feedback signal on the receiver side is controlled by time division or frequency division calibration signals, so that the total amplification of the feedback signal between the adder and the regulator is held constant.

11 Claims, 4 Drawing Figures

MEASURING DEVICE FOR TRANSMITTING MEASURING SIGNALS VIA AN OPTICAL LINK

TECHNICAL FIELD

The present invention relates to a measuring device having a transmitter side that receives an input signal and that transmits the signal to a receiver side over an optical link, and, more particularly, to such a device including means for compensating for variations in the attenuation of signals passed over the optical link.

BACKGROUND ART

It is known that information may be transmitted over an optical link having a light transmitter, a light conducting element and a light detector. Typically, the radiation output of the light transmitter is modulated in accordance with an input signal and the modulated light is transmitted over a light conducting element, such as an optical fiber, to a detector, for example a photodiode, that converts the modulated light to corresponding electrical signals that are proportional to the input signal. The input signal may be generated by a transducer that is employed to measure some physical quantity.

In a measuring device, the signal of the transducer may be applied to modulate the radiation of a light transmitter, such as a light emitting diode on a transmission side of the device. The radiation of the light emitting diode is then transmitted over an optical fiber to a receiving side of the device, wherein the modulated light signal is converted to a corresponding electrical output signal by a photodiode.

The optical transmission of data between a transmitter side and a receiver side of a measuring device is advantageous in that the transmitter and receiver are not electrically connected and, therefore, may be operated at different potential levels. In addition, a data transmission over an optical link cannot be blocked by electromagnetic radiation, while an electrically conducting signal line is sensitive to such radiation. Also, since an optical link does not transmit electrical energy, sparks or short circuits cannot occur and, therefore, an optical link will be much safer than an electrical signal line when used in an environment having combustible or explosive material.

It is highly desirable to reduce the power consumption on the transmitter side of a measuring device as much as possible, since it is often difficult and expensive to supply a great deal of power to the transmitter, especially if the transmitter is located at a remote measuring location where electrical power is not readily available. The requirement of low transmitter power makes it particularly difficult to transmit digital measuring data over an optical link, since a digital transmission normally requires high power digital-to-analog converters and high power light modulators on the transmitter side.

Conventional analog transmissions also have a disadvantage in that the accuracy of a transmission is dependent upon signal attenuation in the optical link, and the attenuation is known to vary for many reasons. For example, a change in the radius of curvature of a light conductor will attenuate a transmitted signal and changes in the amplification of light emitters and light detectors, due to temperature conditions and aging, will also attenuate the signal. Another disadvantage of an analog transmission scheme is that the dynamic range of the analog signal will tend to be small if available power on the transmitter side is low.

Accordingly, it is a primary object of the invention to provide a measuring device having a high accuracy, a large dynamic range and a large band width, and utilizing a low power transmitter that is connected to a receiver by an optical link.

Another object of the invention is to provide such a measuring device including means for automatically compensating for variations in signal attenuation along the optical link.

These and other objects of this invention will become apparent from a review of the detailed specification which follows and a consideration of the accompanying drawings.

DISCLOSURE OF THE INVENTION

In order to achieve the objects of the invention and to overcome the problems of the prior art, the measuring device for transmitting signals via an optical link, according to the invention, includes comparing means disposed on a transmitter side of the measuring device to receive a measurement signal and an amplified feedback signal from a receiver side and to generate a comparison signal having an amplitude that is a function of the magnitude of the measurement signal and the feedback signal.

An optical transmission link is employed to transmit the comparison signal to the receiver side.

A regulator means on the receiver side is employed to receive the comparison signal and to generate a corresponding feedback signal and a receiver output signal having a magnitude corresponding to the magnitude of the measurement signal.

An optical feedback transmission link is employed to amplify the feedback signal and to transmit the feedback signal to the transmitter side.

The amplification in the feedback link on the receiver side is controlled so that the total amplification of the feedback signal between the regulator means and the comparing means is maintained constant. The feedback amplification is controlled by special calibrating signals that may either be time division or frequency division multiplexed with the measurement signal.

The low power for the electrical components on the transmitter side may be supplied by the receiver side over an optical power link.

BEST MODE FOR CARRYING OUT THE INVENTION

Figure 1:
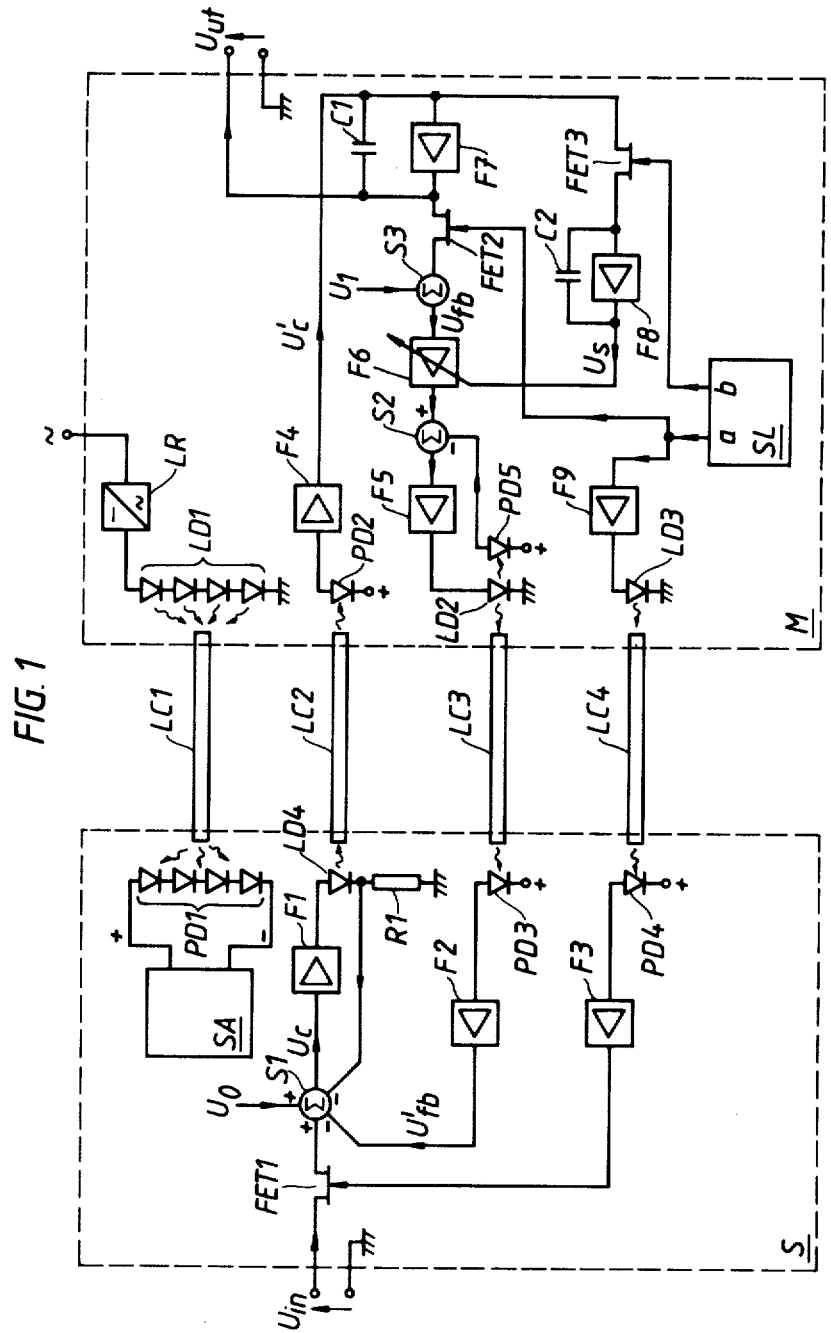
FIG. 1 illustrates a block diagram of a measuring device with time division multiplexed calibration, in accordance with the invention.

The remaining portion of the specification will describe preferred embodiments of the invention when read in conjunction with the attached drawings, in which like reference characters identify identical apparatus.

FIG. 1 shows an optically coupled measuring device, according to the invention, that is employed to convert an analog electric input signal $U_{in}$ into an analog electrical output signal $U_{ut}$. The measuring device has a transmitter side S and a receiver side M that are interconnected by means of four light conductors LC1-LC4. The transmitter and receiver sides may be separated by a distance of, for example, a few meters or many kilometers. The transmitter and receiver may also be positioned at separate electric potentials. Thus, the measuring device of the invention may transmit a current measuring value from a high-voltage conductor on the transmitter side down to ground level on the receiver side. Alternatively, where a moderate potential difference is bridged by the measuring device, the transmitter and receiver sides may be arranged adjacent to one another and the light conductors may be optical couplers having associated light-emitting diodes and photodiodes.

The measuring device operates according to the principle of compensation. In operation, a comparing member, such as the summation circuit S1 on the transmitter side, compares the measuring signal $U_{in}$ with the feedback signal $U'_{fb}$. The difference $U_c$ between these two signals is transferred to the receiver side to control a regulator F7-C1. The output signal of the regulator is the output signal of the measuring device $U_{ut}$, and the feedback signal $U'_{fb}$ is a linear function of the output signal. The regulator F7-C1 is operative until the difference $U_c$ is zero, the output signal $U_{ut}$ of the measuring device then being proportional to its input signal $U_{in}$. The input signal $U_{in}$ of the measuring device is applied to the summation circuit S1 via a field effect transistor FET1 that is controlled by a control logic system SL on the receiver side.

In the summation circuit S1, the input signal $U_{in}$ is compared with the feedback signal $U'_{fb}$ and the difference $U_c$ controls the current that is supplied to a light-emitting diode LD4 by means of an amplifier F1. The resistor R1 is connected in series with the light-emitting diode LD4 and the voltage across the resistor is a measure of the current that passes through the light-emitting diode. The voltage of R1 is fed back to the summation circuit S1, with inverted sign. Thus, a proportional relationship is established between the output signal $U_c$ of the summation circuit and the current of the light-emitting diode LD4, thereby providing good accuracy within an operational range in the vicinity of zero, where the output signal $U_c$ of the summation circuit and the diode current are defined when the measuring device is operating.

The comparison signal $U_c$ is transmitted to the receiver side through the light conductor LC2, a photodiode PD2 and an amplifier F4, to provide a corresponding signal $U'_c$ on the receiver side. The signal $U'_c$ is applied to a regulator including an amplifier F7 and a capacitor C1, having an integrating characteristic. The output signal of the regulator is the output signal $U_{ut}$ of the measuring device. The $U_{ut}$ signal is applied to an amplifier F6, having an amplification that is controlled, by a field effect transistor FET2 and a summation circuit S3.

The output signal of the amplifier F6 is applied to the summation circuit S1 of the transmitter side through a summation circuit S2, an amplifier F5, a light-emitting diode LD2, the light conductor LC3, a photodiode PD3 and an amplifier F2. The light of the light-emitting diode LD2 is also applied to a photodiode PD5 of the same type as the photodiode PD3. The output signal of the photodiode PD5 is then applied to the summation circuit S2, with inverted sign. Thus, the feedback is linearized and, therefore, the output signal of the diode PD3 is a linear function of the signal $U_{fb}$, irrespective of variations (e.g. caused by temperature changes or aging) in the characteristic of the light-emitting diode LD2.

The amplification of the amplifier F6 is controlled by a signal $U_s$ that is generated by applying the comparison signal $U'_c$ to a field effect transistor FET3 and applying the transmitted signal to an integrating regulator comprised of an amplifier F8 and a feedback capacitor C2.

The field effect transistors FET1, FET2 and FET3 operate as switches and are controlled by a control logic circuit SL. The circuit SL may comprise, for example, an astable multivibrator, or another type of oscillator, that emits signals alternately at the two outputs a and b. The signals at the outputs a and b are applied to the transistors FET2 and FET3. The signal from the output a is applied to the transistor FET1 through an amplifier F9, a light-emitting diode LD3, a light conductor LC4, a photodiode PD4 and an amplifier F3. When a signal is generated at the output a, the transistors FET1 and FET2 are operated to conduct. During the conducting time period for FET1 and FET2, designated the measuring interval, the regulator F7-C1 adjusts itself to provide a proportional relationship between the output signal $U_{ut}$ and the measuring signal $U_{in}$. The transistor FET3 does not conduct while FET1 and FET2 are conducting, and, therefore, the output signal of the regulator F8-C2 and the associated amplification of the amplifier F6 is maintained constant.

During the next interval, designated the calibrating interval, an output signal is generated only at the output b of the control logic SL, thereby causing the transistor FET3 to conduct and causing FET1 and FET2 to stop conducting. During the calibration interval, the input signal $U_{in}$ is disconnected from the summation circuit S1, the comparison signal $U'_c$ is connected to the input of the regulator F8-C2 and the amplification of the amplifier F6 is adjusted in the manner described below.

Since alterations of the amplification of the optical link LD2-LC3-PD3 are expected to take place slowly, the measuring intervals may be made long, if desired, with respect to intermediate calibrating intervals. More sophisticated methods may also be used. For example, where the time interval between the calibrating intervals is determined by how rapidly the transmission characteristic between S2 and S3 varies, and where the length of the calibrating interval is determined by how rapidly the regulator F8-C2 is adjusted, an adaptive continuous control of SL may then be carried out with the guidance of the output signals from F7-C1 and F8-C2.

During the calibrating intervals the summation circuits S1 and S3 are supplied only with the two reference voltages $U_0$ and $U_1$, which are carefully maintained at constant values. The reference voltages may be obtained from suitable reference voltage sources, for example temperature-compensated zener diodes.

The regulator F8-C2 is supplied with the comparison signal $U'_c$, which is proportional to the signal $U_c$ and, thus, to the difference between $U_0$ and the feedback signal $U'_{fb}$. The regulator F8-C2 reaches a stationary state when $U_c = U'_c = 0$, that is when $U_0 = U'_{fb}$. However, $U'_{fb} = F \cdot U_1$, where F is the amplification/attenuation in the transmission link for the feedback signal between the summation circuits S3 and S1. Therefore, when the regulator is adjusted, $U_0 = F \cdot U_1$ and the amplification in the transmission link is $F = U_0/U_1$. Thus, during the calibrating intervals, the amplification of the amplifier F6 is adjusted so that the total amplification of the feedback signal is always maintained at the above-mentioned constant value, as determined by the reference voltages.

As indicated above, during the measuring interval the transistors FET1 and FET2 are conducting and the transistor FET3 is not conducting. Therefore, the output signal $U_s$ of the regulator F8-C2 and the associated amplification of the amplifier F6 are constant and equal to the value set during the immediately preceding calibrating interval. During this interval, the regulator F7-C1 operates until its input signal and, thus, the comparison signal $U_c/U'_c$, becomes zero. Then, $$U_{in} + U_0 - U'_{fb} = 0$$

But $$U'_{fb} = F \cdot (U_1 + U_{ut})$$

and $$F = U_0/U_1$$

which gives $$U_{in} + U_0 = U_0/U_1(U_1 + U_{ut})$$

that is $$U_{ut} = U_1/U_0 \cdot U_{in}$$

The amplification $U_{ut}/U_{in}$ of the measuring device is, therefore, maintained carefully constant, irrespective of variations in the amplification of the optical transmissions.

The transmission LD4-LC2-PD2 from the transmitter to the receiver side only operates as a zero point detector. Therefore, the light-emitting diode LD4 may have a very small dynamic range and very low power requirements. The only thing that is required of this transmission is that it shall have a well-defined zero point, which can be easily achieved by means of the above-described current feedback through R1, to S1.

The rest of the transmitter side comprises passive components PD3, PD4 and amplifiers F1, F2, F3, which may be made with conventional, low power circuits. In addition, the amplifier F3 may be omitted if FET1 is a photo-field effect transistor. Also, the function of F2 can be performed by F1 if the photodiode current from PD3 is used directly as an input signal to the summation point S1. Thus, the power requirement of the transmitter side is very low in a measuring device according to the invention and is, in fact, so low that the required energy may be optically transmitted to the transmitter side. An example of such optical energy transmission is shown in FIG. 1. A rectifier or amplifier LR feeds a number of series-connected light-emitting diodes LD1. The emitted light is transmitted to the transmitter side through one or more light conductors LC1, and on the transmitter side the light is transformed into electrical energy by series-connected photodiodes PD1. The electrical energy of the photodiodes is supplied to a current supply circuit SA that energizes the components of the transmitter side. A desirable voltage level may be obtained by connecting a suitable number of photodiodes in series.

In a measuring device according to the invention, the requirement for a high dynamic range and for an associated high energy input is shifted from the light-emitting diode LD4 on the transmitter side to the light-emitting diode LD2 on the receiver side. LD2 may generally be connected at ground potential or at some other reference location where an energy supply may be easily provided. Thus, it should be appreciated that the considerably reduced energy requirement for the transmitter side will normally result in very considerable advantages.

The dynamic range of the measuring device is determined by the characteristics of the feedback link LD2-LC3-PD3, and, since supplying the necessary power to the diode LD2 is not a problem, the measuring device may have a high dynamic range.

The accuracy of the measuring device is also determined by the extent to which the amplification in the feedback link can be accurately maintained at a constant level. It should be understood that the amplification of the feedback link of the circuit of FIG. 1 is accurately maintained at a constant level due to the above-described automatic method of calibration. Therefore, the accuracy of the apparatus of the invention is high. However, it should be appreciated that, for certain applications, the amplification of the feedback link may be maintained relatively constant and may, therefore, be sufficiently accurate, without utilizing the automatic calibration method described above. Accordingly, the automatic calibration circuitry may be omitted for some applications.

The regulator F7-C1 will maintain its output signal practically unchanged during the calibrating intervals, particularly if an additional FET is employed to disconnect the input signal to F7 during the calibrating interval. Thus, a chargeup procedure is not required at the start of each measuring interval, and an increased upper limit frequency results. Accordingly, simpler circuits may be employed to process the output signal of the measuring device.

Although the regulators F7-C1 and F8-C2 are shown in FIG. 1 as regulators with a pure integrating characteristic, it should be understood that the regulators may alternatively have a proportional-integrating characteristic, without departing from the spirit of the invention.

The input signal $U_{in}$ of the measuring device is typically obtained from some form of a transducer. In FIG. 1, it has been assumed that the transducer delivers a voltage. However, the measuring device may receive other types of input signals, without departing from the invention.

The transmission link LD3-LC4-PD4 from the control logic circuit SL to the transistor FET1 may, in certain cases, be omitted if some form of a common timing means, for example the main AC voltage, is available on both the transmitter and the receiver side to control the switching between the measuring and calibrating intervals. Also, power may be supplied to the transmitter side by conventional means different from the disclosed optical power supply apparatus of FIG. 1. If a different power supply technique is employed, the transmission link LD1-LC1-PD1 may be omitted, without departing from the invention.

If desired, a measuring device according to FIG. 1 may be used for transmitting several measuring signals, if the transmitter and receiver sides are provided with multiplex switches that, by turns, switch different input signals into the summation circuit S1 and, in time therewith, switch the output voltage of the regulator F7-C1 between corresponding outputs of the measuring device.

It should be understood that the apparatus of the invention is intended to operate with electromagnetic radiation both within the visible range and within adjacent wavelength ranges. Accordingly, reference to "light conducting" or "light detecting" operation herein is not intended to limit the operation of the invention to any particular range of electromagnetic radiation.

Figure 2:
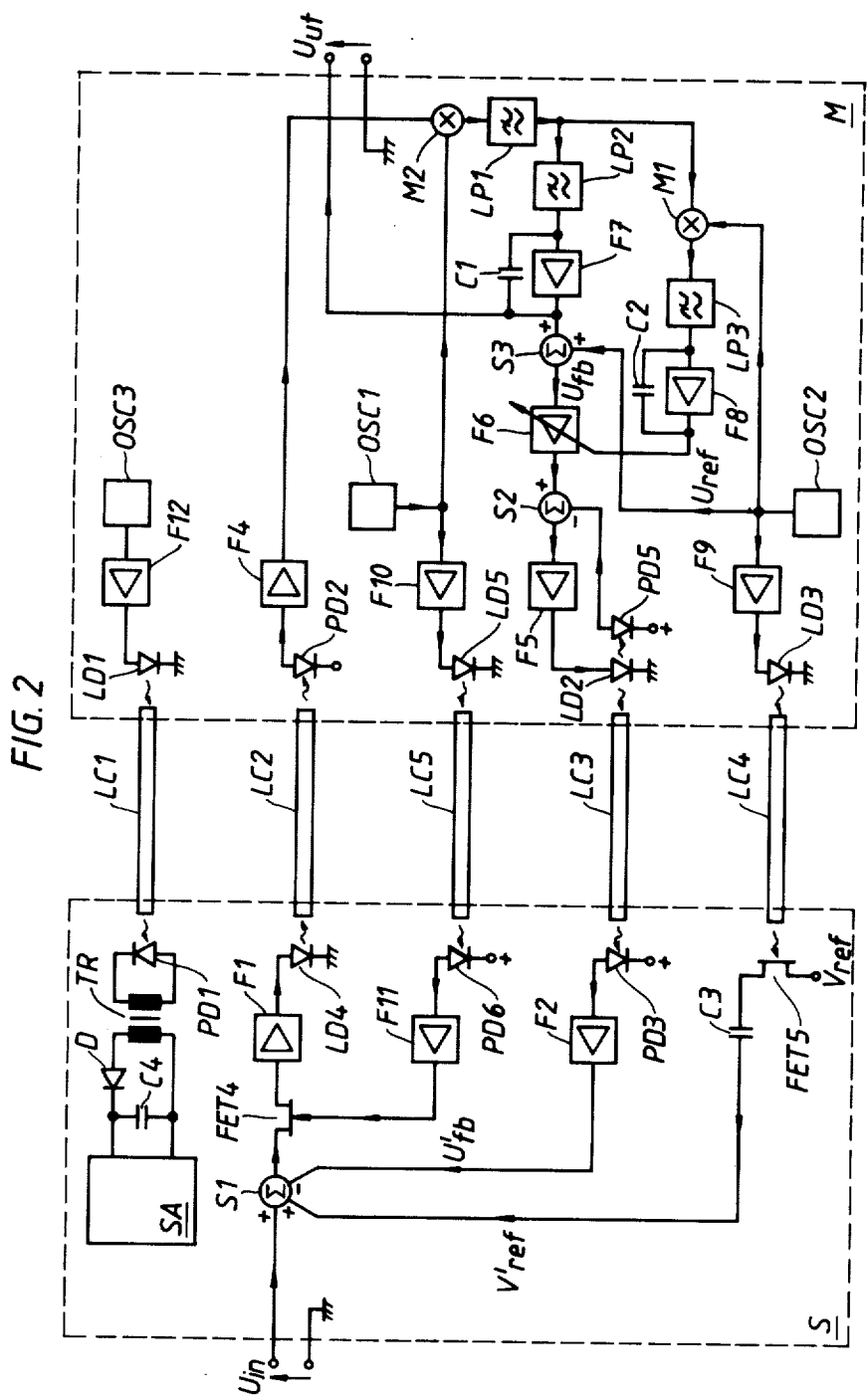
FIG. 2 illustrates a block diagram of a measuring device with frequency division multiplexed calibration, in accordance with the invention.

FIG. 1 shows a measuring device according to the invention, in which measurement and calibration take place alternately and, therefore, can be said to be time-division multiplexed. FIG. 2 shows an alternative embodiment in which the measuring and calibrating signals are transmitted simultaneously, but have different frequencies, that is, they can be said to be frequency-division multiplexed.

As in FIG. 1, the measuring signal $U_{in}$ of FIG. 2 is compared with the feedback signal $U'_{fb}$ in a summator S1. The resulting comparison signal $U_c$ is transmitted via the link LD4-LC2-PD2 to the receiver side, where it controls the regulator F7-C1, the output signal of which constitutes the output signal $U_{ut}$ of the measuring device. The feedback signal is then transmitted to the transmitter side by means of the controllable amplifier F6 and the link LD2-LC3-PD3. A second regulator F8-C2 controls the amplification of the amplifier F6, so that the total amplification of the feedback signal between S3 and S1 is maintained constant. Thus, in principle, the mode of operation of the measuring device of FIG. 2 is the same as for the measuring device of FIG. 1.

The transmission link for the comparison signal of FIG. 2 is stabilized by a chopper. From an oscillator OSC1, which operates with a high frequency $f_1$ in relation to other frequencies occurring in the measuring device, there is obtained a pulse train with the frequency $f_1$. The pulse train is transmitted by an amplifier F10 and the link LD5-DC5-PD6 to the transmitter side, where it controls the transistor FET4 through an amplifier F11. The intermittently operated transistor FET4 operates to chop or sample the comparison signal with frequency $f_1$, and the chopped signal is then transmitted via the link LD4-LC2-PD2 and an amplifier F4 to a demodulator M2, which may be a multiplier circuit. The demodulator is controlled by the output signal of the oscillator OSC1 and, therefore, emits a direct voltage signal that corresponds to the signal component with the frequency $f_1$ in the output signal of the amplifier F4. The direct voltage signal is supplied to a low-pass filter LP1 that filters out the high-frequency demodulation ripple. Thus, the zero signal of the comparison signal $U_c$ is reliably detected in a manner that is not affected by the drift of the zero levels of related components that is caused, for example, by the dark current of the photodiode PD2.

The feedback link S3-S1 is calibrated by means of signals with a frequency $f_0$ that is lower than $f_1$, but higher than the upper limit frequency of the measuring signal $U_{in}$. The oscillator OSC2 emits an output signal with the frequency $f_0$ and an amplitude $U_{ref}$ that is carefully kept constant. The OSC2 output signal is applied to the summation circuit S3 and to an amplifier F9 that transmits the signal to control a photo-field effect transistor FET5 through the light-emitting diode LD3 and the light conductor LC4. The transistor FET5 modulates a reference direct voltage $V_{ref}$ and the alternating voltage component $V'_{ref}$ of the modulated signal is fed to the summation circuit S1 via a decoupling capacitor C3. Therefore, a component with the frequency $f_0$ is included in the comparison signal $U_c$ and is fed via the chopper-stabilized link FET4-F1-LD4-LC2-PD2-F4-M2-LP1 to a demodulator M1, which is controlled by the output signal of the oscillator OSC2. The demodulation ripple of the signal from M1 is removed by a low-pass filter LP3, the output signal of which is a direct voltage with an amplitude corresponding to the amplitude of the component in the comparison signal with the frequency $f_0$. Therefore, the feedback signal $U'_{fb}$ to the summation circuit S1 contains a component $U'_{ref}$ with the frequency $f_0$. The regulator F8-C2 controls the amplification of the amplifier F6 so that the input signal of the regulator becomes zero, that is, so that $U'_{ref} = V'_{ref}$. However, $U'_{ref} = F \cdot U_{ref}$, where F is the amplification in the feedback link between S3 and S1, and $V'_{ref} = \text{const} \cdot V_{ref}$, therefore, $F = \text{const } V_{ref}/U_{ref}$.

Thus, the amplification of the feedback link is automatically maintained at a constant value that is determined by the two reference voltages.

The measuring signal $U_{in}$ is compared in the summation circuit S1 with the feedback signal $U'_{fb}$, and the low-frequency component of the comparison signal $U'_c$ is fed via a low-pass filter LP2 (with a limit frequency which is lower than $f_0$ and $f_1$) to the regulator F7-C1. The regulator operates until its output voltage $U_{ut}$ is such that $U_{ut} \cdot F = U_{in}$, that is, the amplification $U_{ut}/U_{in} = U_{ref}/\text{const} \cdot V_{ref}$ of the measuring device becomes constant, independently of, for example, alterations of the amplification of the optical link LD2-LC3-PD3.

For the embodiment of FIG. 2, the output signals of the oscillators OSC1 and OSC2 on the receiver site are passed to the transmitter side. However, it should be understood that the transmission of oscillator signals may be avoided if separate oscillators are employed on the transmitter side. The separate oscillators may be crystal-controlled, as are the oscillators OSC1 and OSC2, so that each pair of oscillators will have the same frequency. If separate oscillators are used, demodulators such as M1 and M2 may not be used, however, band pass filters and rectifier circuits may be employed to perform the demodulation function.

Power is transmitted to the transmitter side of the embodiment of FIG. 2 over an optical link that is similar to the link employed in FIG. 1, although of different design. In the power link of FIG. 2, an oscillator OSC3 delivers a pulsating direct voltage that is amplified by an amplifier F12 and applied to a light-emitting diode (or semi-conductor laser) LD1. The radiation of LD1 is passed to a photodiode PD1 over a light conductor LC1. The alternating voltage component of the current of the photodiode PD1 is stepped up to a suitable voltage level by a transformer TR and is rectified by a peak value rectifier, comprised of a diode D and a capacitor C4. The rectified, stepped up voltage is then applied to current supply circuits SA that distribute power to the electrical circuits of the transmitter side.

Figure 3:
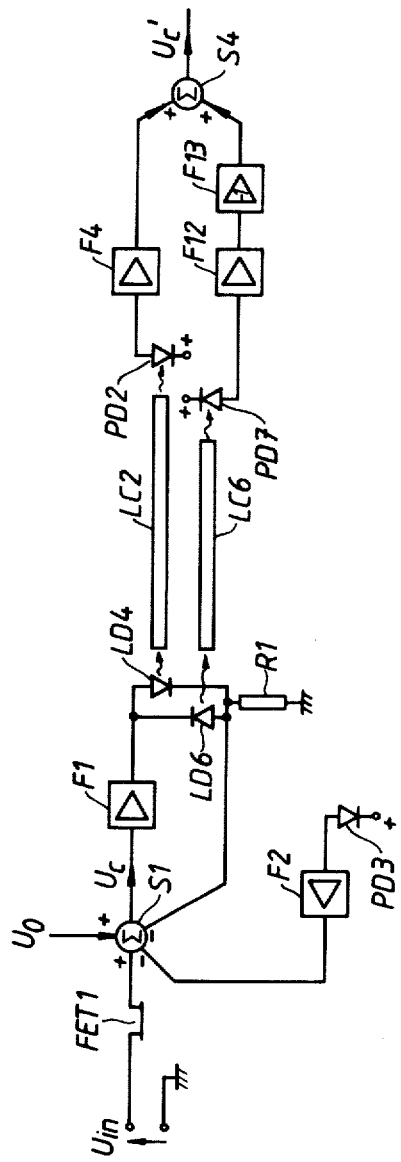
FIG. 3 illustrates a block diagram of an alternative embodiment of a measuring device wherein a bipolar comparison signal is transmitted.

FIG. 3 shows an alternative embodiment of the transmission link for the comparison signal $U_c$. The light-emitting diode LD4 of FIG. 3 is connected in parallel in opposed relation to a light-emitting diode LD6 that generates radiation that is passed to a photodiode PD7 over a light conductor LC6. The output signal of the photodiode PD7 is amplified by a first amplifier F12 and a second, sign reversed, amplified signal is then applied to a summation circuit S4. In a similar fashion, the radiation of LD4 is passed to a photodiode PD2 and the corresponding signal of PD2 is amplified by an amplifier F4 and applied to the summation circuit S4. In operation, a positive error signal $U_c$ is transmitted over the path F1-LD4-LC2-PD2-F4-S4 and a negative error signal is transmitted over the path F1-LD6-LC6-PD7-F12-F13-S4. Thus, the control characteristics of the system are improved, since both positive and negative error signals are transmitted.

Figure 4:
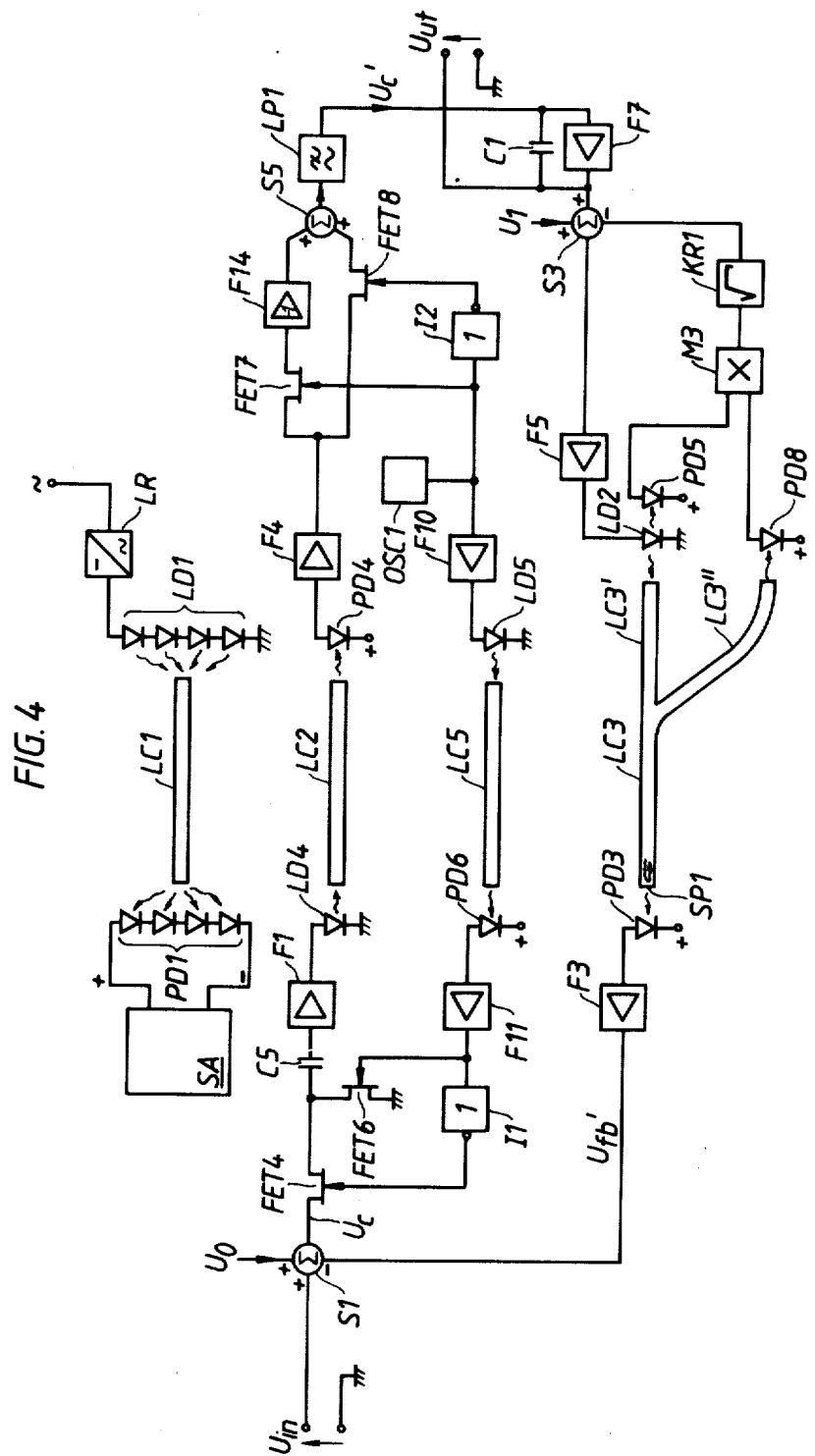
FIG. 4 illustrates a block diagram of an alternative embodiment of a measuring device wherein a branched light conductor is employed to compensate for variations in the attenuation of a feedback signal.

In the embodiments of FIGS. 1 and 2, time division multiplexed and frequency division multiplexed calibrating signals are respectively used to compensate for variations in the attenuation of the feedback signal that passes over the feedback transmission link. FIG. 4 shows an alternative method of compensating for variations in the attenuation of radiation that passes over the light conductor that is employed in the feedback transmission link.

In the embodiment of FIG. 4, the measuring signal $U_{in}$ is applied to the summation circuit S1, where it is compared with the feedback signal $U'_{fb}$. The difference signal $U_c$ is then applied to a light emitting diode LD4 via a field effect transistor FET4, a capacitor C5 and an amplifier F1. The output signal of LD4 is passed to the photodiode PD2 over the light conductor LC2 and the signal of the photodiode PD2 is applied to an amplifier F4. The amplified signal is then applied to a summation circuit S5 over a first path comprising a field effect transistor FET7 and an associated sign reversing amplifier F14, and a second path comprising a field effect transistor FET8. The output signal of the summation circuit S5 is then applied to an integrator F7-C1 through a low pass filter LP1. The output signal of the integrator F7-C1 is, of course, the output signal $U_{ut}$ as is defined for the embodiments of FIGS. 1 and 2.

The transmission link for the feeback signal includes an amplifier F5 and a light-emitting diode LD2 that passes radiation over a light conductor LC3. The radiation from LC3 is received by a photodiode PD3 and the signal of the photodiode is amplified by an amplifier F3. It should be understood that the output signal of the amplifier F3 is the feedback signal $U'_{fb}$.

A semi-reflecting mirror SP1 is disposed at the transmitter end of the light conductor LC3 to reflect a part of the radiation of the conductor LC3 back to the receiver side. At the receiver side, the light conductor LC3 divides into two branches LC3' and LC3", and a particular portion of the reflected light is passed along the branch LC3" to a photodiode PD8. The output signal of PD8 is applied to a first input of a multiplier M3. The second input of the multiplier M3 is connected to a photodiode PD5 that generates a signal that is proportional to the light intensity of the light emitting diode LD2. The output signal of the multiplier is applied to a square root generator KR1, and the square root signal of KR1 is then subtracted from the signal $U_{ut}$ in a summation circuit S3.

Reference voltages $U_0$ and $U_1$ are respectively applied to summation circuits S1 and S3, thereby providing an alternating polarity for the measuring signal $U_{in}$ and output signal $U_{ut}$, even though the feedback signal $U'_{fb}$ has only one polarity.

An oscillator OSC1 controls the transistor FET4 through an amplifier F10, light-emitting diode LD5, light conductor LC5, photodiode PD6, amplifier F11 and sign reversing amplifier I1. The oscillator OSC1 operates the transistor FET1 to sample or chop the error signal $U_c$. During the non-conducting intervals of FET4, the signal $U_c$ is short-circuited to ground by a field effect transistor FET6 that is controlled by the output signals of the amplifier F11. The alternating voltage component of the chopped error signal $U_c$ is transmitted to the receiver side and the direct component is blocked by a capacitor C5. Field effect transistors FET7 and FET8, amplifier F14, sign reversing amplifier I2 and the summer S5 form a phase-controlled rectifier that re-forms the error signal $U'_c$ at the receiver side.

It should be understood that the supply circuit L4, LD1, LC1, PD1 and SA for the embodiment of FIG. 4 is the same as the supply circuit for the embodiment of FIG. 1.

If the intensity of the radiation that is passed into the light conductor LC3 from LD2 is $I_1$, a radiation intensity $I_2$ may be defined as the radiation that is received at the transmitter end of LC3. $I_2$ is then proportional to $K \cdot I_1$, where K is the attenuation factor of the light conductor LC3. A reflected radiation intensity $I_3$ may be measured at the receiver end of the light conductor LC3", and the intensity $I_3$ is proportional to $K^2 \cdot I_1$. A signal that is proportional to $K^2 \cdot I_1$ is applied by PD8 to the second input of the multiplier M3 and the photodiode PD5 applies a signal proportional to $I_1$ to the first input of M3. Thus, the output signal of the multiplier corresponds to $k^2 \cdot I_1^2$, and KR1 generates a signal corresponding to $k \cdot I_1$. The amplifier F5 has a high amplification and controls the light intensity of the light-emitting diode LD2 so that $k \cdot I_1$ is always proportional to the signal $U_{ut}$. Since the light intensity received by the photodiode PD3 is proportional to $k \cdot I_1$, $U'_{fb}$ is proportional to $U_{ut}$ and is, therefore, independent of variations in the attenuation factor of the light conductor LC3.

It should be understood that the light-emitting diodes and related apparatus used for the above-described embodiments of the invention may be replaced by other known apparatus that emits or detects electromagnetic radiation. Moreover, if there is a relatively short distance between the transmitter and receiver sides, the light conductors LC1-LC5 may be omitted or replaced by a lens system. The elimination of the photo-conductors may be advantageous where, for example the transmitter and receiver sides move with respect to one another. Also, it should be understood that several of the signals may be transmitted on the same light conductor, for example by using light of different wavelengths, or frequency-modulated light having different modulating frequencies for the different signals.

In the embodiments described above, the comparison signal $U_c$ is defined as the difference between the measuring signal $U_{in}$ and the feedback signal $U'_{fb}$. Alternatively, a comparison signal may be defined as the quotient of the two signals or any other specified relation between the two signals, without departing from the invention.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

We claim:

1. In a measuring device of a type having a transmitter side and a receiver side, the transmitter side receiving at least one input measurement signal and transmitting the at least one input measurement signal over an optical link to the receiver side, the improvement comprising:

comparing means on said transmitter side for receiving the at least one measurement signal and a feedback signal from said receiver side and generating a corresponding comparison signal having an amplitude that is a function of the magnitude of the measurement signal and the received feedback signal;

first optical transmission link means for transmitting said comparison signal from the transmitter side to the receiver side;

regulator means with integrating characteristic on said receiver side for receiving the transmitted comparison signal and for generating a feedback signal having a magnitude corresponding to the magnitude of the measurement signal; and second optical transmission link means for transmitting the feedback signal from the receiver side to the transmitter side in the form of a light signal, the light intensity of which is a direct measure of said feedback signal.

2. The apparatus of claim 1 wherein said feedback transmitting link means includes controllable amplifier means for receiving the feedback signal of the regulator means and amplifying the feedback signal for transmission to the transmitter side, the controllable amplifier means including control means for maintaining the total amplification of the feedback signal from said regulator means to said comparing means at a constant value.

3. The apparatus of claim 2 wherein said feedback transmission link means includes summing means for applying a first calibrating signal having a predetermined magnitude to define the feedback signal on the receiver side and said comparing means includes means for receiving on the transmitter side a second calibrating signal having a predetermined magnitude, the comparing means generating said comparison signal in accordance with the magnitude of the second calibrating signal and the feedback signal defined by the first calibrating signal, and said control means includes means responsive to the comparison signal generated from the calibrating signals for controlling the amplification of said controllable amplifier means.

4. The apparatus of claim 3 including means for defining alternating calibration intervals and measuring intervals, the first calibrating signal applied alone by said summing means to define the feedback signal on the receiver side and the second calibrating signal and the feedback signal applied by said comparing means to define a corresponding comparison signal during the calibration intervals.

5. The apparatus of claim 3 including means for defining periodically varying first and second calibrating signals, the first periodically varying signal being applied by said summing means with the feedback signal of said regulator means to define a periodically varying feedback signal and the second periodically varying calibrating signal being applied by said comparing means with the measurement signal and the periodically varying feedback signal to define a periodically varying comparison signal.

6. The apparatus of claim 1 wherein said transmission link means includes a light emitting diode with current feedback means for accurately transmitting the comparison signal to the receiver side.

7. The apparatus of claim 1 wherein said feedback transmission link means includes a light emitting diode with optical feedback means for accurately transmitting the feedback signal to the transmitter side.

8. The apparatus of claim 1 including means for optically transmitting power from the receiver side to the transmitter side for energizing the transmitter side.

9. The apparatus of claim 1 wherein said transmission link means includes first and second parallel transmission channel means, the first channel means transmitting positive values of the comparison signal and the second channel means transmitting negative values of the comparison signal.

10. The apparatus of claim 1 wherein said feedback transmission link includes:

light emitting means for generating radiant energy data signals;

light detecting means for transforming radiant energy into corresponding electrical signals;

light conducting means optically connecting the light emitting means and the light detecting means for transmitting radiant energy between the light emitting means and the light detecting means;

reflecting means disposed between said light conducting means and said light detecting means for partially transmitting radiant energy from the light conducting means to the light detecting means and for partially reflecting radiant energy back through the light conducting means;

means responsive to the intensity of the reflected radiant energy transmitted back through the light conducting means for controlling the intensity of the radiant energy emitted by the light emitting means to compensate for variations in the radiation attenuation of the light conducting means.

11. The apparatus of claim 1 wherein said transmission link means includes transistor means for modulating the comparison signal on the transmitter side and multiplier means for demodulating the comparison signal on the receiver side.

* * * * *